(12) United States Patent
Ando et al.

(10) Patent No.: US 8,344,422 B2
(45) Date of Patent: Jan. 1, 2013

(54) SEMICONDUCTOR DEVICE

(75) Inventors: Yuji Ando, Tokyo (JP); Yasuhiro Okamoto, Tokyo (JP); Kazuki Ota, Tokyo (JP); Takashi Inoue, Tokyo (JP); Tatsuo Nakayama, Tokyo (JP); Hironobu Miyamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 162 days.

(21) Appl. No.: 12/810,096

(22) PCT Filed: Dec. 25, 2008

(86) PCT No.: PCT/JP2008/003948
§ 371 (c)(1),
(2), (4) Date: Jun. 22, 2010

(87) PCT Pub. No.: WO2009/081584
PCT Pub. Date: Jul. 2, 2009

(65) Prior Publication Data
US 2010/0276732 A1    Nov. 4, 2010

(30) Foreign Application Priority Data
Dec. 26, 2007 (JP) ................................ 2007-334674

(51) Int. Cl.
*H01L 29/66* (2006.01)
*H01L 29/08* (2006.01)
*H01L 29/778* (2006.01)

(52) U.S. Cl. ........ 257/192; 257/194; 257/200; 257/410; 257/E33.048; 257/E31.047; 257/E21.625

(58) Field of Classification Search ................. 257/183, 257/184, 189, 190, 192, 194, 196, 200, 201, 257/410, E33.004, E33.034, E33.038, E31.047, 257/E29.08, E29.092, E21.297, E29.315, 257/E21.625, E21.639; 438/46, 47, 478, 438/482, 488, 287, 585, 591, FOR. 177
See application file for complete search history.

(56) References Cited

U.S. PATENT DOCUMENTS

| | | | | |
|---|---|---|---|---|
| 5,323,020 A | * | 6/1994 | Mohammad et al. | ........... 257/19 |
| 7,851,825 B2 | * | 12/2010 | Suh et al. | ........................ 257/194 |
| 2003/0102482 A1 | * | 6/2003 | Saxler | .............................. 257/85 |
| 2003/0203604 A1 | * | 10/2003 | Makita | ........................... 438/571 |
| 2008/0121932 A1 | * | 5/2008 | Ranade | ........................... 257/192 |

FOREIGN PATENT DOCUMENTS

JP    11-261052 A    9/1999
(Continued)

OTHER PUBLICATIONS

International Search Report for PCT/JP2008/003948 mailed Mar. 17, 2009.
O. Aktas et al., "Microwave performance of AlGaN/GaN Inverted MODFET's", IEEE Electron Device Letters, vol. 18, No. 6, Jun. 1997, pp. 293-295.
Ching-Ting Lee et al., "GaN MOS Device Using SiO2-Ga2O3 Insulator Grown by Photoelectrochemical Oxidation Method", IEEE Electron Device Letters, vol. 24, No. 2, Feb. 2003. pp. 54-56.

*Primary Examiner* — Olik Chaudhuri
*Assistant Examiner* — Quovaunda V Jefferson

(57) ABSTRACT

A semiconductor device includes a lower barrier layer 12 composed of a layer of $Al_xGa_{1-x}N$ ($0 \leq x \leq 1$) in a state of strain relaxation, and a channel layer 13, which is composed of a layer of $In_yGa_{1-y}N$ ($0 \leq y \leq 1$) disposed on the lower barrier layer 12, has band gap that is smaller than band gap of the lower barrier layer 12, and exhibits compressive strain. A gate electrode 1G is formed over the channel layer 13 via an insulating film 15 and a source electrode 1S and a drain electrode 1D serving as ohmic electrodes are formed over the channel layer 13. The insulating film 15 is constituted of polycrystalline or amorphous member.

8 Claims, 10 Drawing Sheets

FOREIGN PATENT DOCUMENTS

| | | | |
|---|---|---|---|
| JP | 2000252458 A | 9/2000 |
| JP | 2000294768 A | 10/2000 |
| JP | 2004335960 A | 11/2004 |
| JP | 2007165719 A | 6/2007 |
| JP | 2007329483 A | 12/2007 |
| WO | 03071607 A | 8/2003 |

* cited by examiner

FIG. 5
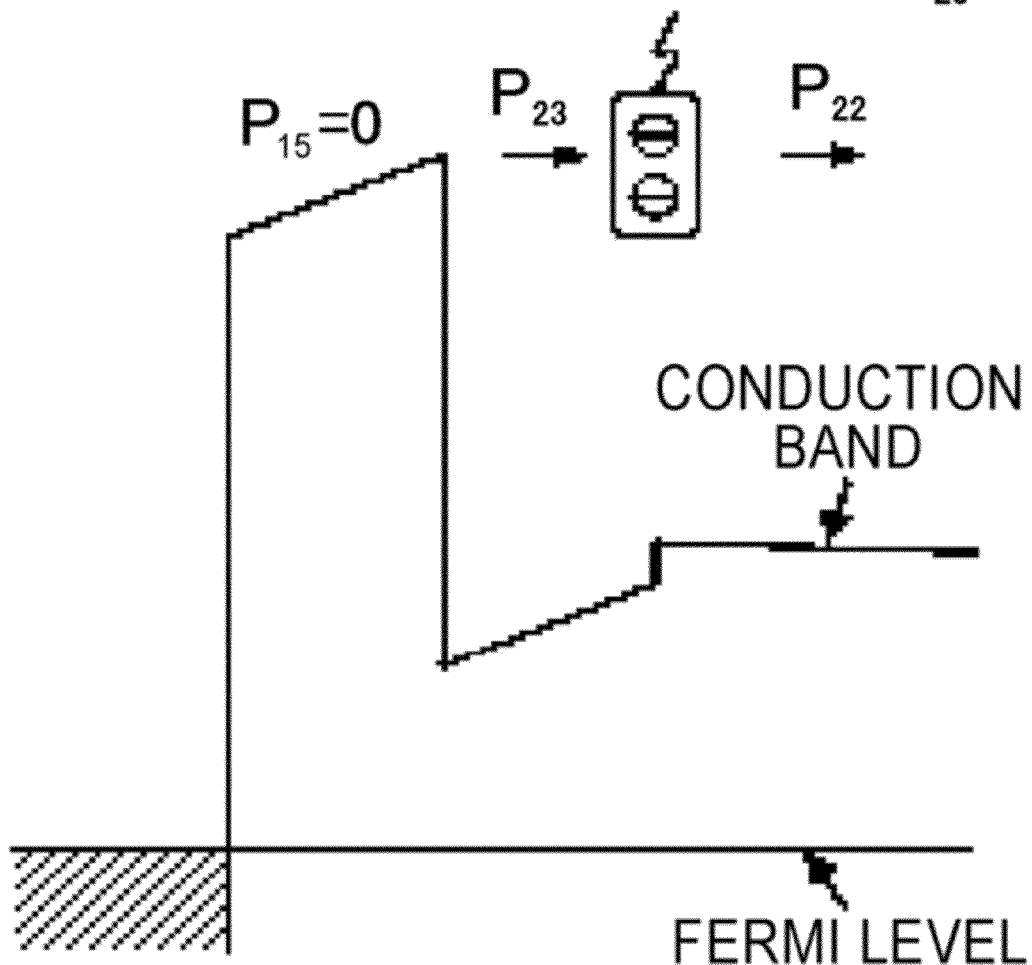
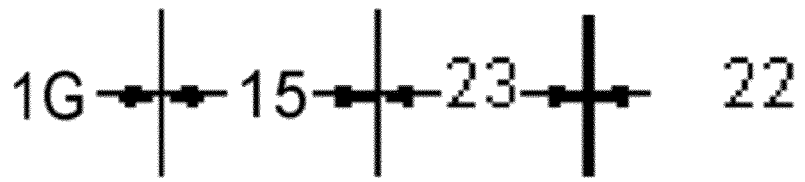

SEMICONDUCTOR DEVICE

TECHNICAL FIELD

The present invention relates to a semiconductor device.

BACKGROUND ART

FIG. 7 is a diagram, illustrating a cross-sectional structure of a semiconductor device according to a conventional technology. Such semiconductor device is reported by, for example, Imanaga et al. in Patent Document 1. In FIG. 7, reference numeral 100 indicates a sapphire substrate, which is a substrate of (0001) face, namely C face, reference numeral 101 indicates a buffer layer, reference numeral 102 indicates an electron-supplying layer composed of N-type aluminum gallium nitride ($Al_zGa_{1-z}N$) (hereinafter, referred to as AlGaN electron-supplying layer), reference numeral 103 indicates a channel layer composed of gallium nitride (GaN) (hereinafter, referred to as GaN channel layer), and reference numeral 104 indicates an insulating layer composed of undoped aluminum nitride (AlN) (hereinafter referred to as AlN insulating layer). A source electrode 10S and a drain electrode 10D is formed on the AlN insulating layer 104 to create ohmic contacts. A gate electrode 10G is formed in a location disposed between the source electrode 10S and the drain electrode 10D on the AlN insulating layer 104 to create a Schottky contact. Such semiconductor device is referred to as a semiconductor device having a double heterostructure.

FIG. 8 is an energy band diagram under a gate in a semiconductor device shown in FIG. 7. In the double heterostructure, two-dimensional electron gas 107 is generated in vicinity of an interface of the GaN channel layer 103 with the AlGaN electron-supplying layer 102 and in vicinity of an interface of the GaN channel layer 103 with the AlN insulating layer 104. The band gap of AlN constituting the AlN insulating layer 104 is larger in this structure, which leads to characteristics of enhanced Schottky barrier and improved forward gate breakdown voltage of the semiconductor device.

Besides, Imanaga et al. also reports in Patent Document 2 a semiconductor device of the double heterostructure, in which the AlN insulating layer of Patent Document 1 is replaced with a multiple-layered structure of an AlN layer and a silicon dioxide ($SiO_2$) layer.

Further, Patent Document 3 and Non-Patent Document 1 disclose semiconductor devices having structures, in which the respective layers of AlGaN/GaN/AlGaN insulating layer stacked in this sequence on a substrate.

Besides, a semiconductor device having a silicon nitride (SiN) insulating film provided on a double heterostructure of GaN/N-type AlGaN/GaN is reported in Patent Document 4. Since interface charges generated in two heterointerfaces cancel each other out in this structure, no two-dimensional electron is generated in a thermal equilibrium state of Vg=0 V to allow an enhancement operation.

Further, C. T. Lee et al. discloses in Non-Patent Document 2 a semiconductor device provided with an insulating film composed of a multiple-layered member of gallium oxide ($Ga_2O_3$) and $SiO_2$ formed on an N-type GaN channel layer, and also reports a semiconductor device having a metal-insulator-semiconductor (referred to as "MIS") structure.

Patent Document 1
Japanese Patent Laid-Open No. 2000-294,768
Patent Document 2
Japanese Patent Laid-Open No. 2000-252,458
Patent Document 3
Japanese Patent Laid-Open No. H11-261,052 (1999)
Patent Document 4
Japanese Patent Laid-Open No. 2004-335,960
Non-Patent Document 1
IEEE Electron Device Letters, Vol. 18, pp. 293 to 295, 1997
Non-Patent Document 2
IEEE Electron Device Letters, Vol. 24, pp. 54 to 56, 2003

DISCLOSURE OF THE INVENTION

The semiconductor device of Patent Document 1 involves a problem, in which uniformity and reproducibility of threshold voltage are considerably reduced, due to a polarizing effect of the AlN insulating layer 104. The polarizing effect will be described in detail below. While a strain relaxation is achieved in the AlGaN electron-supplying layer 102 in the semiconductor device of FIG. 7, the GaN channel layer 103 and the AlN insulating layer 104 are thinner than a critical thickness for generating dislocation, functioning as a strain lattice layer.

As shown in FIG. 8, a polarization $P_{102}$ is generated in the AlGaN electron-supplying layer 102 from the side of the GaN channel layer 103 toward the direction for the substrate 100 due to a spontaneous polarization. In addition, since a compressive strain is created in the GaN channel layer 103, a piezo polarization is generated toward a direction for cancelling out the spontaneous polarization, and weak polarization $P_{103}$ is generated from the side of the AlN insulating layer 104 toward the direction for the substrate 100. Further, since a tensile strain is created in the AlN insulating layer 104, a piezo polarization is generated toward a direction for strengthening together with the spontaneous polarization, and a strong polarization $P_{104}$ is generated from the side of a surface provided with electrodes 10S, 10D and 10G toward the direction for the substrate 100.

The intensity of these polarizations depends on Al composition (z) of the AlGaN electron-supplying layer 102, and for example, in the case of z=0.1, it is calculated that $P_{102}/q=2.13\times10^{13}$ cm$^{-2}$, $P_{103}/q=1.61\times10^{13}$ cm$^{-2}$, and $P_{104}/q=7.90\times10^{13}$ cm$^{-2}$. Here, q is an elementary charge, and presented as $q=1.6\times10^{-19}$ C.

Next, an estimation of an interface charge density resulted from, the polarizing effect presents that $\sigma_{103}=(P_{103}-P_{102})/q=-5.28\times10^{12}$ cm$^{-2}$ in an Interface of the AlGaN electron-supplying layer 102 and the GaN channel layer 103, and $\sigma_{104}=(P_{104}-P_{103})/q=+7.90\times10^{13}$ cm$^{-2}$ in an interface of the AlN insulating layer 104 and the GaN channel layer 103. In this structure, positive charge ($\sigma_{104}$) generated in the interface of the AlN insulating layer 104 and the GaN channel layer 103 is larger than negative charge ($\sigma_{103}$) generated in the interface of the AlGaN electron-supplying layer 102 and the GaN channel layer 103. Thus, two-dimensional electron gas 107 is generated in the GaN channel layer 103 even if no impurity is added to the AlGaN electron-supplying layer 102, and therefore this functions as a depression type semiconductor device.

FIG. 9 shows dependency of the threshold voltage over the thickness of the AlN insulating layer 104, obtained by solving Poisson's equation for such semiconductor device. Results of different impurity concentrations in the AlGaN electron-supplying layer 102 are shown in the graph. It is indicated by the calculation that the internal electric field of the AlN insulating layer 104 reaches 10 MV/m. This results in that a threshold voltage has shifted by an amount of 1 V when the thickness of the AlN insulating layer 104 is changed by 1 nm, and thus uniformity and reproducibility of the threshold voltage are extremely lower. Further, the thickness of the AlN insulating layer 104 for providing the threshold voltage as 0 V is equal to or lower than 1 nm, and therefore it is difficult to achieve an enhancement in view of ensuring sufficient gate breakdown voltage. Further, positive charge ($\sigma_{104}$) is generated with increased density in the interface of the AlN insulating layer 104 and the GaN channel layer 103, so that an internal electric field of the AlN insulating layer 104 is increased, causing a problem of an increase in a tunneling current component in the case of applying an inverse bias, which leads to increased gate leakage current.

In the structure disclosed in Patent Document 2, the AlN insulating layer has the polarizing effect, so that the internal electric field of the insulating layer is higher and uniformity and reproducibility of the threshold voltage are decreased, similarly as in Patent Document 1.

Further, in the structure disclosed in Patent Document 3 and Non-Patent Document 1, the AlGaN insulating layer has the polarizing effect so that the internal electric field of the insulating layer is higher and uniformity and reproducibility of the threshold voltage are decreased, similarly as in Patent Document 1.

Further, as described above, the semiconductor device having the silicon nitride (SiN) insulating film provided on the double heterostructure of GaN/N-type AlGaN/GaN is reported in Patent Document 4. Since interface charges generated in two heterointerfaces cancel each other out in this structure, no two-dimensional electron is generated in a thermal equilibrium state of Vg=0 V to allow an enhancement operation.

FIG. 10 shows dependency of the threshold voltage over the thickness of the SiN film, obtained by solving Poisson's equation for the semiconductor device of Patent Document 4. Results of different thicknesses and different impurity concentrations in the AlGaN electron-supplying layer 102 are shown in FIG. 10. It is indicated by the calculation that the dependency of threshold voltage on the thickness of the SiN film is relatively smaller, and thus it is understood that the uniformity and the reproducibility of the threshold voltage are improved. However, a range for controlling the threshold voltage is narrow, and further, a range of the impurity concentration in the AlGaN layer for providing positive threshold voltage is significantly narrower. This is resulted from that a summation of polarized charges in the heterointerface results in zero. In such semiconductor device, a smaller amount of contamination with N-type impurity in the AlGaN layer causes a generation of two-dimensional electron during the process for manufacturing the semiconductor device, causing a possibility for providing negative threshold voltage.

According to one aspect of the present invention there is provided a semiconductor device, comprising: a lower barrier layer composed of a layer of $Al_xGa_{1-x}N$ ($0 \leq x \leq 1$) in a state of strain relaxation; and a channel layer composed of a layer of $In_yGa_{1-y}N$ ($0 \leq y \leq 1$) disposed on said lower barrier layer, said channel layer having band gap that is smaller than band gap of said lower barrier layer and exhibiting compressive strain, wherein a gate electrode is formed over said channel layer via an insulating film and a source electrode and a drain electrode are formed over said channel layer, and wherein said insulating film is polycrystalline or amorphous.

In addition to above, since the channel layer is composed of a layer having a smaller band gap than the lower barrier layer in the present invention, none of the channel layer and the lower barrier layer is be composed of a GaN layer.

According to the present invention, a semiconductor device, which provides improved uniformity and the reproducibility of the threshold voltage while maintaining lower gate leakage current and also provides broader range for controlling the threshold voltage, is presented.

BRIEF DESCRIPTION OF THE DRAWINGS

The above and other objects, advantages and features of the present invention will be more apparent from the following description of certain preferred embodiments taken in conjunction with the accompanying drawings.

FIG. 5 It is an energy band diagram for a region under a gate electrode of second embodiment according to the present invention.

Preferable embodiments of the present invention will be described in reference to annexed figures. In all figures, an identical numeral is assigned to an element commonly appeared in the figures, and the detailed description thereof will not be repeated.

FIRST EMBODIMENT

Figure 1:
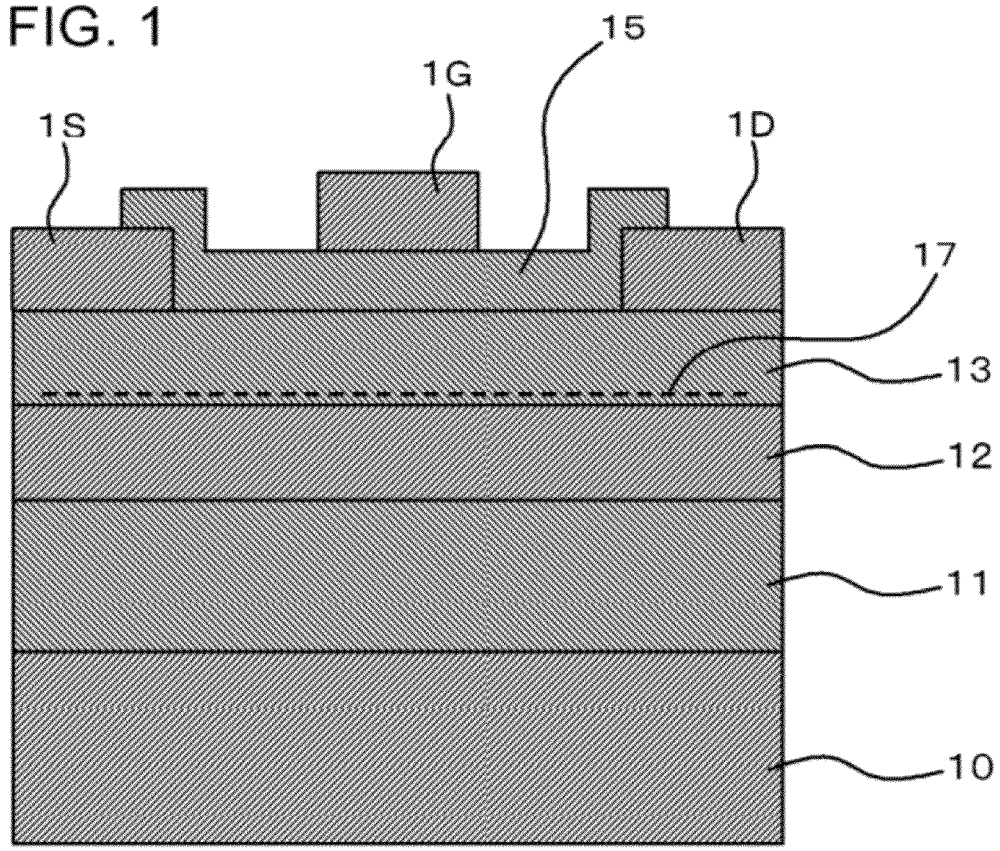
FIG. 1 It is a diagram of a cross-sectional structure of a first embodiment of according to the present invention.

A semiconductor device according to first embodiment of the present invention will be described in reference to FIG. 1 to FIG. 3. In the beginning, an overview of a semiconductor device of the present embodiment will be described. A semiconductor device of the present embodiment includes a lower barrier layer 12 composed of a layer of $Al_xGa_{1-x}N$ ($0 \leq x \leq 1$) in a state of strain relaxation, and a channel layer 13, which is composed of a layer of $In_yGa_{1-y}N$ ($0 \leq y \leq 1$) disposed on the lower barrier layer 12, has band gap that is smaller than band gap of the lower barrier layer 12, and exhibits compressive strain. A gate electrode 1G is formed over the channel layer 13 via an insulating film 15 and a source electrode 1S and a drain electrode 1D serving as ohmic electrodes are formed over the channel layer 13. The insulating film 15 is constituted of polycrystalline or amorphous member. The semiconductor device of the present embodiment is a hetero junction field effect transistor (HJFET). Since the insulating film 15 is composed of polycrystalline or amorphous film according to the semiconductor device of the present embodiment, no polarization is caused. Therefore, the internal electric field in the insulating film 15 is reduced, so that dependency of the threshold voltage on the thickness of the insulating film 15 is relatively reduced, providing improved uniformity and the reproducibility of the threshold voltage. A polarization is generated from a front surface toward a back surface of the channel layer 13 in the lower barrier layer 12 composed of the $Al_xGa_{1-x}N$ ($0 \leq x \leq 1$) layer in a state of strain relaxation due to a spontaneous polarization. Since a compressive strain is generated in the channel layer 13, a piezo polarization is generated toward a direction for cancelling out the spontaneous polarization, and a weak polarization is generated toward from the side of the front surface toward the side of the back surface of the channel layer. Here, since an intensity of polarization in the lower barrier layer 12 composed of the $Al_xGa_{1-x}N$ ($0 \leq x \leq 1$) layer in a state of strain relaxation is larger than an intensity of polarization in the channel layer 13 composed of an $In_yGa_{1-y}N$ ($0 \leq y \leq 1$) layer having a compressive strain, a negative charge is generated in a heterointerface of the lower barrier layer 12 and the channel layer 13 disposed on the above-described lower barrier layer 12, providing broader range for controlling the threshold voltage. More specifically, if no N-type impurity is added to the lower barrier layer 12 in the case that the heterointerface includes negative charge, no two-dimensional electron gas is present in a state that no positive voltage is applied to the gate electrode. Therefore, it is possible to provide a semiconductor device of an enhancement mode, which provides a positive threshold voltage. While a positive charge is generated in the interface of the channel layer 13 with the lower barrier layer 12 when an N-type impurity is added to the lower barrier layer 12, no two-dimensional electron gas is generated if quantity of positive charge is smaller than quantity of negative charge. Thus, even the value of the threshold voltage is reduced, it is possible to provide a semiconductor device of an enhancement mode, which provides a positive threshold voltage. On the other hand, if a certain or more amount of an N-type impurity is added in lower barrier layer 12, quantity of positive charge is larger than quantity of negative charge in the interface of the channel layer 13 with the lower barrier layer 12, so that two-dimensional electron gas is created. This allows providing a semiconductor device of depression mode with negative threshold voltage. As described above, broader range for controlling the threshold voltage is presented in the semiconductor device of the present embodiment. Further, even if the lower barrier layer 12 is contaminated with an N-type impurity in the semiconductor device of the present embodiment, the N-type impurity concentration of not larger than a certain range still allows providing the semiconductor device of enhancement mode, and thus enhanced manufacturing stability is achieved.

Further, since the insulating film 15 is composed of a film of polycrystalline or monocrystalline material, no polarized electric field is generated. Therefore, the internal electric field in the insulating film 15 is smaller, and a component of a tunneling current is reduced when an inverse bias is applied, thereby achieving reduced gate leakage current. Further, the lower barrier layer 12 composed of the $Al_xGa_{1-x}N$ ($0 \leq x \leq 1$) layer in a state of strain relaxation and the channel layer 13 composed of the $In_yGa_{1-y}N$ ($0 \leq y \leq 1$) layer having a compressive strain are stacked. Since such lower barrier layer 12 and channel layer 13 can be formed via an epitaxial growing process, an atomic-level flat profile can be achieved in the heterointerface of the lower barrier layer 12 with the channel layer 13, through which electron travels. Therefore, two-dimensional mobility of electron can be enhanced. In addition to above, the structure disclosed in Non-Patent Document 2 is characterized in that the band gap of $SiO_2$ and $Ga_2O_3$ constituting the insulating film are larger, so that the Schottky barrier height is increased and the forward gate breakdown voltage is improved. Further, the insulating film generates no polarization, and thus the uniformity and the reproducibility of the threshold voltage are good. However, such structure has a problem, in which electron mobility is considerably deteriorated. In reality, Non-Patent Document 2 reports that the Hall mobility of electron is 350 cm$^2$/Vs, which is significantly lower mobility. It is considered that this is due to an influence of interface scattering resulted from a roughness in the interface of the insulating film with the channel layer.

Next, the semiconductor device of the present embodiment will be described in detail. As shown in FIG. 1, a semiconductor device includes a silicon carbide (SiC) substrate 10 of (0001) face, a buffer layer 11 formed on the SiC substrate 10, a lower barrier layer 12 formed on the buffer layer 11, and a channel layer 13. Two-dimensional electron gas 17 is generated in vicinity of an interface of the channel layer 13 with the lower barrier layer 12 A source electrode 1S and a drain electrode 1D are formed on the channel layer 13 to provide ohmic contacts. A gate electrode 1G is formed via insulating film 15 on a site of the channel layer 13 sandwiched by the source electrode 1S and the drain electrode 1D to provide Schottky contact. In the present embodiment, the insulating film 15 covers the entire surface of the channel layer 13 except the surfaces coated with the source electrode 1S and drain electrode 1D, in addition to the region under the gate electrode 1G. Further, in the present embodiment, the circumference section of the insulating film 15 covers sections of upper surfaces of the source electrode 1S and the drain electrode 1D. More specifically, the insulating film 15 covers the region of the channel layer 13 sandwiched by the source electrode 1S and the drain electrode 1D and the sections of upper surfaces of the source electrode 1S and the drain electrode 1D. This allows a surface charge of the channel layer 13 being immobilized to provide improved stability of the semiconductor device. In view of reducing the gate leakage current to provide improved transconductance and reducing the film stress, the thickness of the insulating film 15 may be preferably, for example, equal to or larger than 5 nm and equal to or smaller than 200 nm.

Further, it is sufficient that the insulating film 15 may be polycrystalline or amorphous, and is a silicon nitride film ($Si_3N_4$) in the present embodiment. Such insulating film 15 functions as providing increased Schottky barrier with the gate electrode 1G, providing enhanced the forward gate breakdown voltage of the semiconductor device. The insulating film 15 is formed directly on the channel layer 13.

Here, in the present embodiment, the buffer layer 11 is an undoped gradient-composition AlGaN layer. The composition of Al in the buffer layer 11 is gradually decreased from 1 to 0.1 as approaching the lower barrier layer 12 from the side of the substrate 10. The Lower barrier layer 12 is, in the present embodiment, an AlGaN layer, and the Al composition is x=0.1. Further, the lower barrier layer 12 is doped with an N-type impurity, and the N-type impurity concentration may be, for example, $2 \times 10^{18}$ cm$^{-3}$. The available N-type impurity may be, for example, silicon (Si). Here, the buffer layer 11 functions as releasing a strain energy by generating a dislocation, and the lattice constant of the uppermost surface is provided to be identical with that of the lower barrier layer 12. This buffer layer 11 serves as a layer of a buffer for providing a state of strain relaxation (no strain) for the lower barrier layer 12. The thickness of the buffer layer 11 may be preferably, for example, equal to or larger than 0.1 μm and equal to or smaller than 10 μm, in order to reduce an influence of the dislocation.

Further, the lower barrier layer 12 creates lattice match with an uppermost surface of the buffer layer 11, and thus exhibits no strain, or namely is in strain relaxation. The thickness of the lower barrier layer 12 is required to be thinner to the extent of completely depleting the n-type impurity, in view of providing improved pinch-off characteristics, and is preferably determined for providing a sheet impurity concentration (=impurity concentration×thickness) of equal to or lower than $1\times10^{14}$ cm$^{-2}$.

Further, the channel layer 13 is an undoped GaN layer. The thickness of the channel layer 13 is thinner than a critical thickness, and may be preferably equal to or larger than 5 nm and equal to or smaller than 200 nm.

Such semiconductor device is manufactured as follows. The buffer layer 11 (1 μm), the lower barrier layer 12 (50 nm) and a channel layer 13 (30 nm) are deposited in this sequence on a (0001) face SiC substrate 10 via, for example, a metalorganic chemical vapor deposition (abbreviated as MOCVD) process. Good value of the mobility of the two-dimensional electron gas 17 of about 1500 cm$^2$/Vs is obtained. This is resulted from the fact that an interface scattering is inhibited, since the heterointerface of the channel layer 13 composed of the GaN layer and the lower barrier layer 12 composed of the AlGaN layer, through which electron travels, has an atomic-level flat profile. Since the channel layer 13 and the lower barrier layer 12 are formed by an epitaxial growing process, the heterointerface is provided as an atomic-level flat profile. It is considered that this allows inhibiting the interface scattering. Further, another factor for the improvement in the electron mobility is that an ionized impurity scattering is inhibited since the channel layer 13 is undoped.

Metals such as, for example, titanium (Ti)/aluminum (Al)/nickel (Ni)/gold (Au) are deposited and/or alloy-treated on the channel layer 13 composed of the GaN layer to form the source electrode 1S and the drain electrode 1D, respectively, to create ohmic contacts. Next, for example, a plasma-enhanced chemical vapor deposition (abbreviated as PECVD) process is employed to deposit, for example, 40 nm, of the insulating film 15. The insulating film 15 is formed to cover the region on the channel layer 13 sandwiched in between the source electrode 1S and the drain electrode 1D. The region on the surface of the insulating film 15 sandwiched in between the source electrode 1S and the drain electrode 1D is provided with, for example, the gate electrode 1G, which is formed by depositing and lifting off metals such as Ti/platinum (Pt)/Au to create a Schottky contact. In this way, the semiconductor device as shown in FIG. 1 is manufactured.

Figure 2:
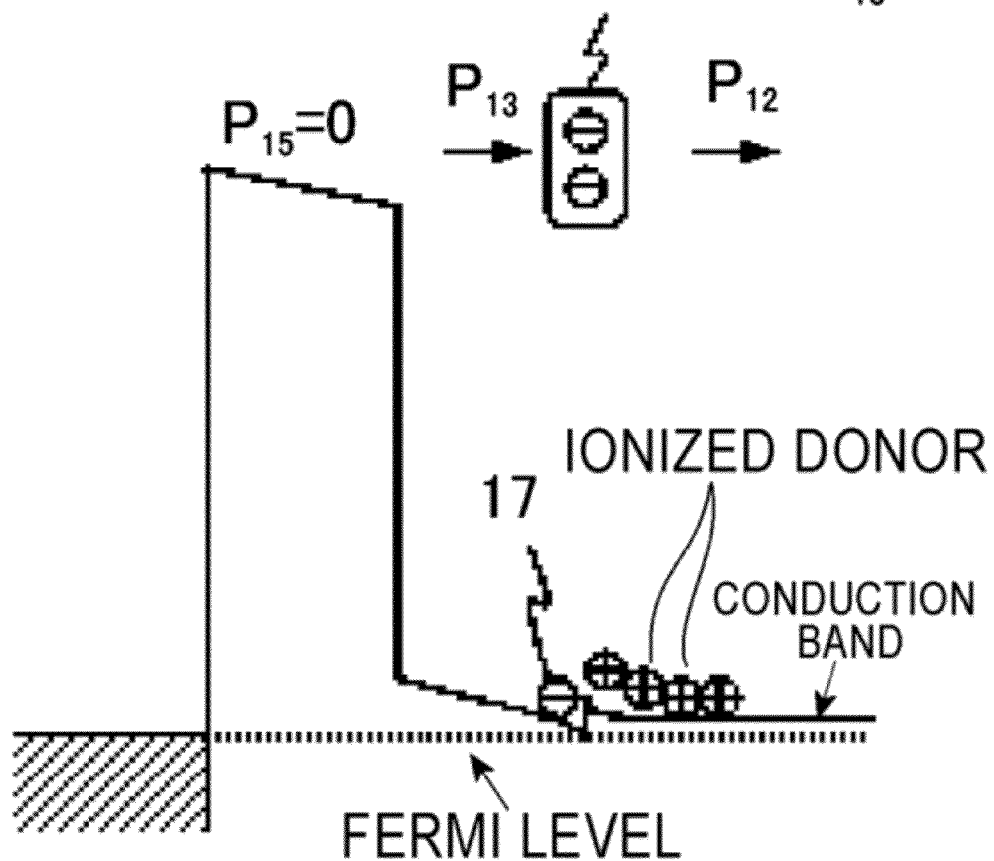
FIG. 2 It is an energy band diagram for a region under a gate electrode of first embodiment according to the present invention.

FIG. 2 is an energy band diagram for the region under the gate electrode 1G in the present embodiment. While the lower barrier layer 12 composed of the (0001) face AlGaN layer is in strain relaxation, the channel layer 13 composed of the GaN layer is thinner than a critical thickness for generating a dislocation, and thus serves as a strain lattice layer. A polarization P12 is generated due to the spontaneous polarization in the lower barrier layer 12 composed of the AlGaN layer along the direction from the surface in the side of the channel layer 13 toward the substrate 10. Since a compressive strain is generated in the channel layer 13 composed of the GaN layer, a piezo polarization is generated along a direction for cancelling off the spontaneous polarization, and a weak polarization $P_{13}$ is also generated along a direction toward the substrate 10 from the side of the insulating film 15. Since the insulating film 15 composed of the $Si_3N_4$ film is polycrystalline or amorphous, no polarization is generated in the insulating film 15 ($P_{15}$=0). The intensity of the polarizations depends on the Al composition (x) in the lower barrier layer 12 composed of the AlGaN layer, and for example, in the case of x=0.1, it is calculated that $P_{12}/q=2.13\times10^{13}$ cm$^{-2}$ and $P_{13}/q=1.61\times10^{13}$ cm$^{-2}$.

Next, a density of an interface charge generated in the interface of the lower barrier layer 12 with the channel layer 13 by these polarizing effects is estimated, and it is found that $\sigma_{13}=(P_{13}-P_{12})/q=-5.28\times10^{12}$ cm$^{-2}$. In addition to above, an electric charge generated in the interface of the channel layer 13 with the insulating film 15 is compensated with the interface state, and thus is not shown. In the present embodiment, a negative charge ($\sigma_{13}$) in density per unit area of $5.28\times10^2$ cm$^{-2}$ is generated in the interface of the lower barrier layer 12 composed of the AlGaN layer with the channel layer 13 composed of the GaN layer by the polarizing effect. On the other hand, a positive charge in density per unit area of $1\times10^{13}$ cm$^{-2}$ is generated, which is resulted from an ionization of an N-type impurity added to the lower barrier layer 12. Since the positive charge is larger, a two-dimensional electron gas 17 is generated in vicinity of the interface of the lower barrier layer 12 with the channel layer 13 even in a thermal equilibrium state of $V_g$=0 V. More specifically, this functions as a depression type semiconductor device.

Figure 3:
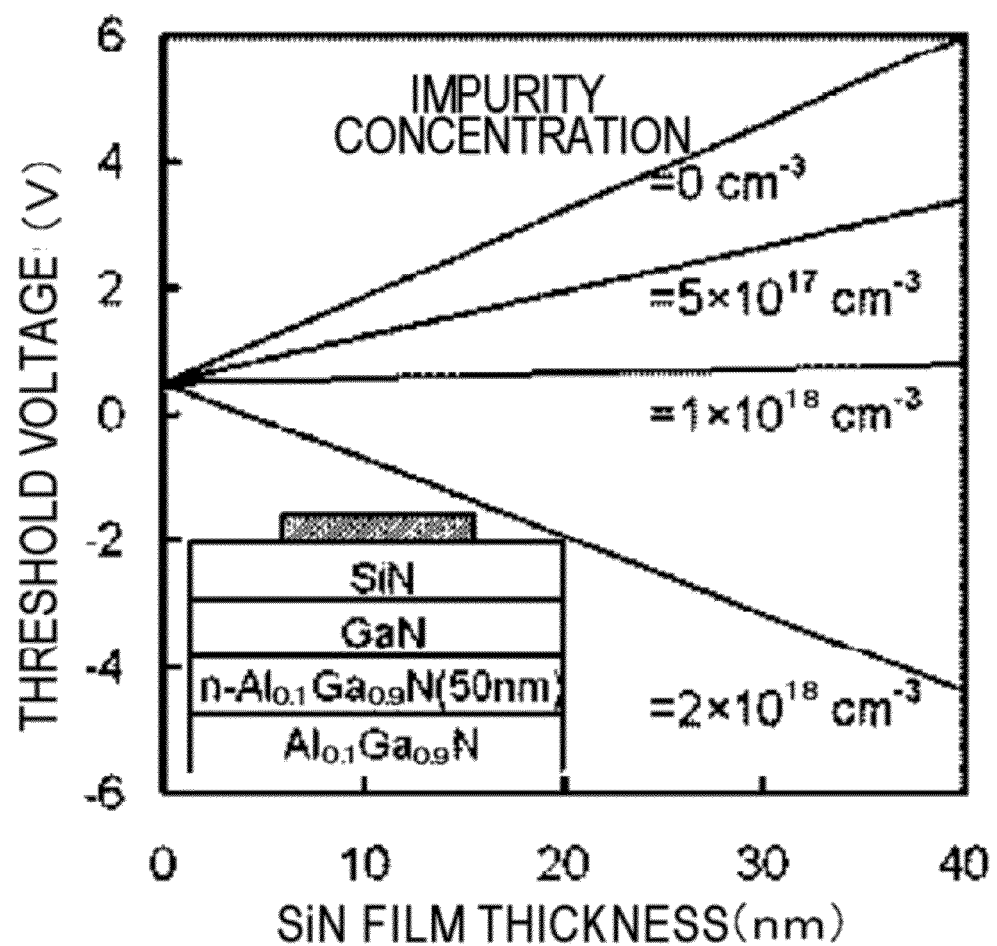
FIG. 3 It is a graph showing dependency of threshold voltage of a semiconductor device on a thickness of an insulating film according to the present invention.

FIG. 3 shows a dependency of the threshold voltage on the thickness of the insulating film 15, which is obtained by solving Poisson equation for such semiconductor device. Results for different concentrations of an N-type impurity in the lower barrier layer 12 are shown in FIG. 3. It can be understood that the range for controlling the threshold voltage is larger, and the threshold voltage can be controlled to be either positive or negative by changing the thickness of the insulating film 15 composed of the $Si_3N_4$ film and the concentration of the N-type impurity in the lower barrier layer 12. More specifically, while the device is a depreciation type in the case of the present embodiment (concentration of impurity=$2\times10^{18}$ cm$^{-3}$), the device may alternatively produced as an enhancement type by reducing the concentration of the N-type impurity in the lower barrier layer 12 to a level of equal to or lower than $1\times10^{18}$ cm$^{-3}$. This is because a negative electric charge ($\sigma_{13}$) is present in the interface of the lower barrier layer 12 and the channel layer 13, and if the surface density of the N-type impurity is lower than $|\sigma_{13}/q|$ (up to $5\times10^{12}$ cm$^{-2}$), it is meant that no two-dimensional electron is generated in thermal equilibrium state. Consequently, it is not susceptible to the influences from the residual impurity, the composition, and the ununiformity of the layer thickness, and therefore it can be stably achieve an enhancement operation. Further, it is also found in FIG. 3 that the internal electric field of the insulating film 15 depends on the concentration of the N-type impurity in the lower barrier layer 12. In case of the present embodiment (concentration of impurity=$2\times10^{18}$ cm$^{-3}$), the value of the electric field is about 1.2 MV/cm, and the shifted value of the threshold voltage for changing the thickness of the $Si_3N_4$ film 15 by 1 nm is relatively small, namely about 0.12 V, and therefore enhanced uniformity and reproducibility of the threshold voltage are presented. Larger band gap of $Si_3N_4$ constituting the insulating film 15 provides an increased Schottky barrier height. Thus, enhanced forward gate breakdown voltage of the semiconductor device is also achieved. Further, smaller internal electric field of the insulating film 15 allows inhibiting the tunneling current component in the case of the inverse biasing and reducing reverse leakage current.

SECOND EMBODIMENT

First embodiment requires reducing the concentration of the N-type impurity in the lower barrier layer 12 for achieving an enhancement operation. However, when the concentration of the N-type impurity in the lower barrier layer 12 is reduced, a carrier density in a section under an ohmic electrode is also simultaneously decreased, causing a problem of increased access resistance. The present embodiment provides a solution for such problem.

Figure 4:
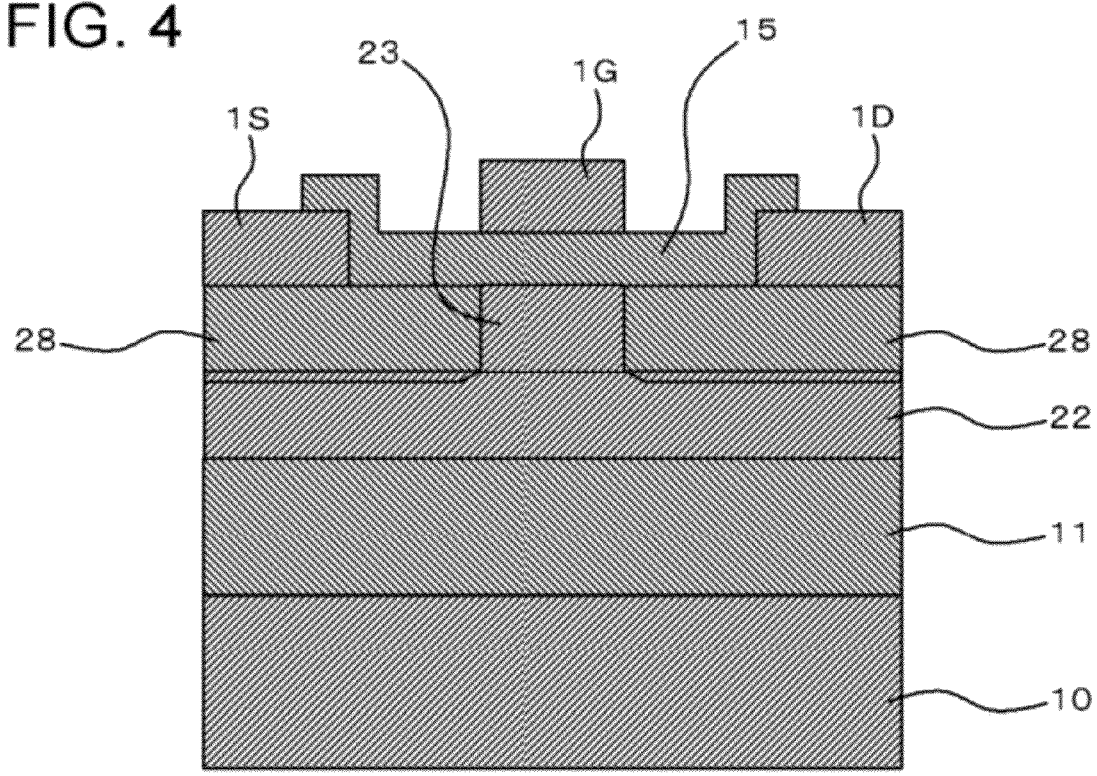
FIG. 4 It is a cross-sectional structure of a second embodiment according to the present invention.

FIG. 4 is a diagram, showing a cross-sectional structure illustrating a semiconductor device of the present embodiment. A semiconductor device of the present embodiment is different from that of the above-described embodiment, in the configuration that a region 28 doped with an N-type impurity is formed in the channel layer 23 and the lower barrier layer 22. Other configurations are similar to that of the above-described embodiment. The semiconductor device of the present embodiment will be described in detail below. The semiconductor device of the present embodiment includes a substrate 10, a buffer layer 11, and an insulating film 15, similarly as in the above-described embodiment.

The lower barrier layer 22 is formed on the buffer layer 11, and is composed of an undoped $Al_xGa_{1-x}N$ layer (for example, x=0.1). The lower barrier layer 22 is a layer in a state of strain relaxation, and the thickness thereof is similar to that of the above-described embodiment. Further, the lower barrier layer 22 is an epitaxially grown layer. The channel layer 23 is formed on the lower barrier layer 22, and is composed of an undoped GaN layer, which is epitaxially grown. The channel layer 23 is a layer having a compressive strain, and the thickness thereof is similar to that of the above-described embodiment. The region 28 doped with an N-type impurity (for example, Si) is formed across the lower barrier layer 22 and the channel layer 23. The region 28 is formed in a region of the lower barrier layer 22 containing regions under the source electrode 1S and under the drain electrode 1D except the section right under the gate electrode 1G, namely in the entire region except the section right under the gate electrode 1G in the present embodiment. The region 28 is provided so as to be in contact with the region of the lower barrier layer 22 right under the gate electrode 1G. Further, the region 28 is formed in a region of a surface layer of the channel layer 23 containing region under the source electrode 1S and the drain electrode 1D except a section right under the gate electrode 1G, namely in the entire region except the section right under the gate electrode 1G in the present embodiment. More specifically, the region 28 reaches a surface layer of the channel layer 23 from the lower barrier layer 22.

Such semiconductor device is manufactured as follows. The buffer layer 11, the lower barrier layer 22, and the channel layer 23 are formed by a similar process as employed in the above-described embodiment. Next, a patterned resist is formed in a site corresponding to a region right under the gate electrode 1G, and Si ion is injected through a mask of the resist at a dose level of, for example, $5 \times 10^{13}$ $cm^{-2}$, and then an activating annealing process is conducted. In this way, the region 28 doped with the N-type impurity is formed. The above-described resist is stripped, and then the source electrode 1S and the drain electrode 1D are formed, respectively, by a similar process as employed in the above-described embodiment to create ohmic contacts. In next, the insulating film 15 is deposited by a similar process as employed in the above-described embodiment. In the last, the gate electrode 1G is formed by a similar process as employed in the above-described embodiment to create a Schottky contact. In this way, the semiconductor device as shown in FIG. 4 is manufactured.

According to the present embodiment, the following advantageous effects can be provided, in addition to the similar advantageous effects as obtained in the aforementioned embodiment. FIG. 5 is an energy band diagram for a section under the gate electrode 1G in the present embodiment. FIG. 5 shows that, while the lower barrier layer 22 composed of the AlGaN layer is in strain relaxation, the channel layer 23 composed of the GaN layer is thinner than a critical thickness for generating dislocation and thus serves as a strain lattice layer. A polarization P22 is generated due to the spontaneous polarization in the lower barrier layer 22 along the direction from the side of the channel layer 23 toward the substrate 10. Since a compressive strain is generated in the channel layer 23, a piezo polarization is generated along a direction for cancelling off the spontaneous polarization, and a weak polarization $P_{23}$ is also generated along a direction toward the substrate 10 from the side of the insulating film 15. Since the insulating film 15 is polycrystalline or amorphous, no polarization is generated in the insulating film 15 ($P_{15}$=0). The intensity of the polarizations depends on the Al composition (x) in the lower barrier layer 12, and for example, in the case of x=0.1, it is calculated that $P22/q=2.13 \times 10^{13}$ $cm^{-2}$ and $P23/q=1.61 \times 10^{13}$ $cm^{-2}$. Next, a density of an interface charge generated in the interface of the lower barrier layer 22 with the channel layer 23 by these polarizing effects is estimated, and it is found that $\sigma 23 = (P_{23} - P_{22})/q = -5.28 \times 10^{12}$ $cm^{-2}$. In addition to above, an electric charge generated in the interface of the channel layer 23 with the insulating film 25 is compensated with the interface state, and thus is not shown. In the present embodiment, a negative charge ($\sigma_{23}$) is generated in the interface of the AlGaN layer 22 with the GaN layer 23 by the polarizing effect. Such negative charge achieves that it is not susceptible to the influences from the residual impurity and the composition, and therefore it can be stably achieve an enhancement operation. More specifically, no carrier is present in the channel layer 23 in a thermal equilibrium state of Vg=0 V. An application of a positive voltage to the gate induces generating a two-dimensional electron gas in the interface between the lower barrier layer 22 and the channel layer 23 and passing a drain electric current, and the semiconductor device functions as an enhancement type device. While electron travels in vicinity of the interface of the channel layer 23 with the insulating film 15 under the gate electrode 1G in this situation, an ionized impurity scattering is inhibited since the GaN layer 23 is undoped, and thus electron mobility is improved.

Further, carrier electron is present at high density in the inside of the region 28 doped with Si ion regardless of the gate voltage. Thus, an increase in the access resistance is inhibited without a depletion of carrier in the region except the section under the gate electrode 1G in the enhancement operation. FIG. 3 shows that, in case of the present embodiment (concentration of impurity=0 $cm^{-3}$), the shifted value of the threshold voltage for changing the thickness of the insulating film 15 of the $Si_3N_4$ film by 1 nm is relatively small, namely about 0.14 V, and therefore enhanced uniformity and reproducibility of the threshold voltage are presented. Larger band gap of silicon nitride constituting the insulating film 15 provides an increased Schottky barrier height. Thus, enhanced forward gate breakdown voltage of the semiconductor device is also achieved. Further, smaller internal electric field of the insulating film 15 of the $Si_3N_4$ film allows inhibiting the tunneling current component and reducing reverse leakage current in the case of the inverse biasing. While the channel layer 23 composed of the GaN layer and the lower barrier layer 22 composed of the AlGaN layer are doped with the N-type impurity in the present example, only in channel layer 23, of course, may be doped. Alternatively, the lower barrier layer 22 may be doped.

THIRD EMBODIMENT

Figure 6:
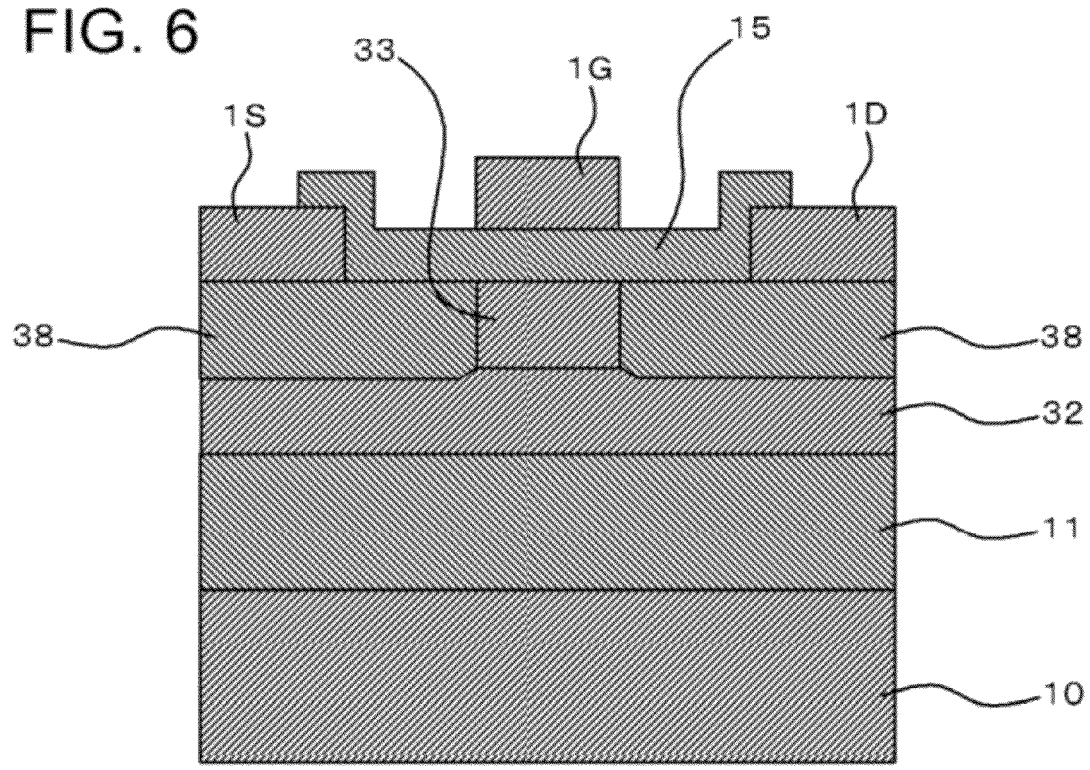
FIG. 6 It is a diagram of a cross-sectional structure of third embodiment according to the present invention.
Figure 7:
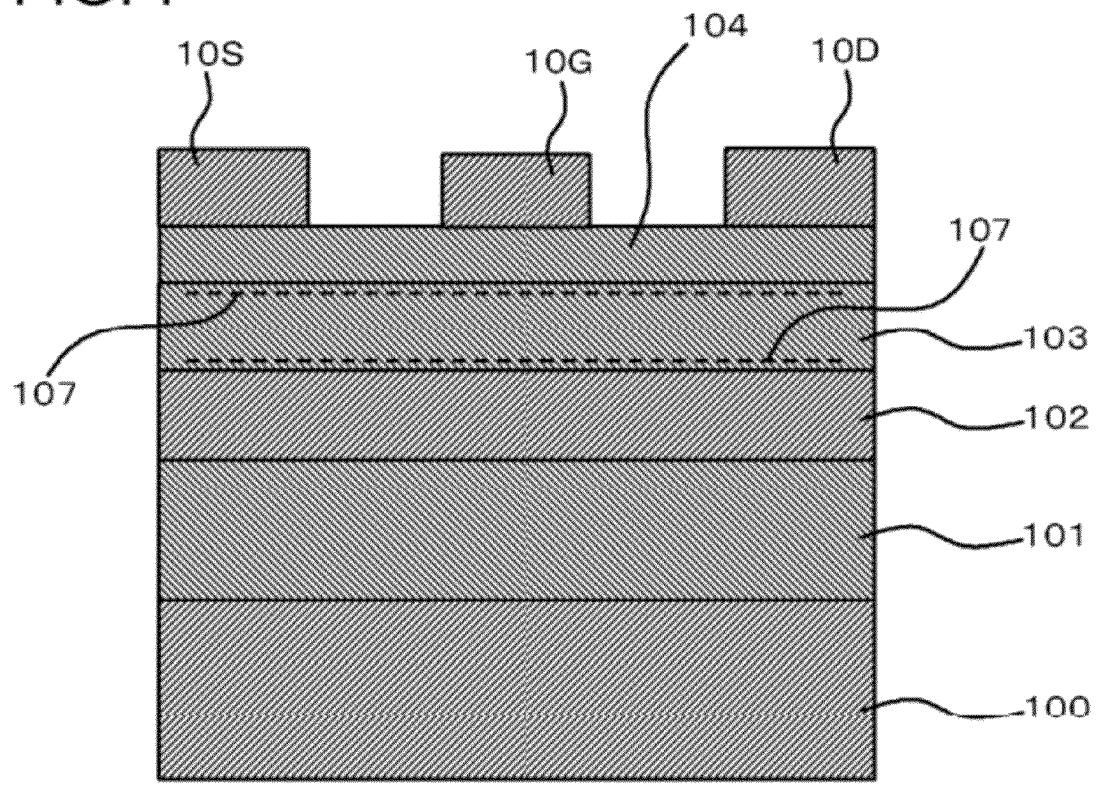
FIG. 7 It is a diagram of a cross-sectional structure of a semiconductor device according to a conventional technology.
Figure 8:
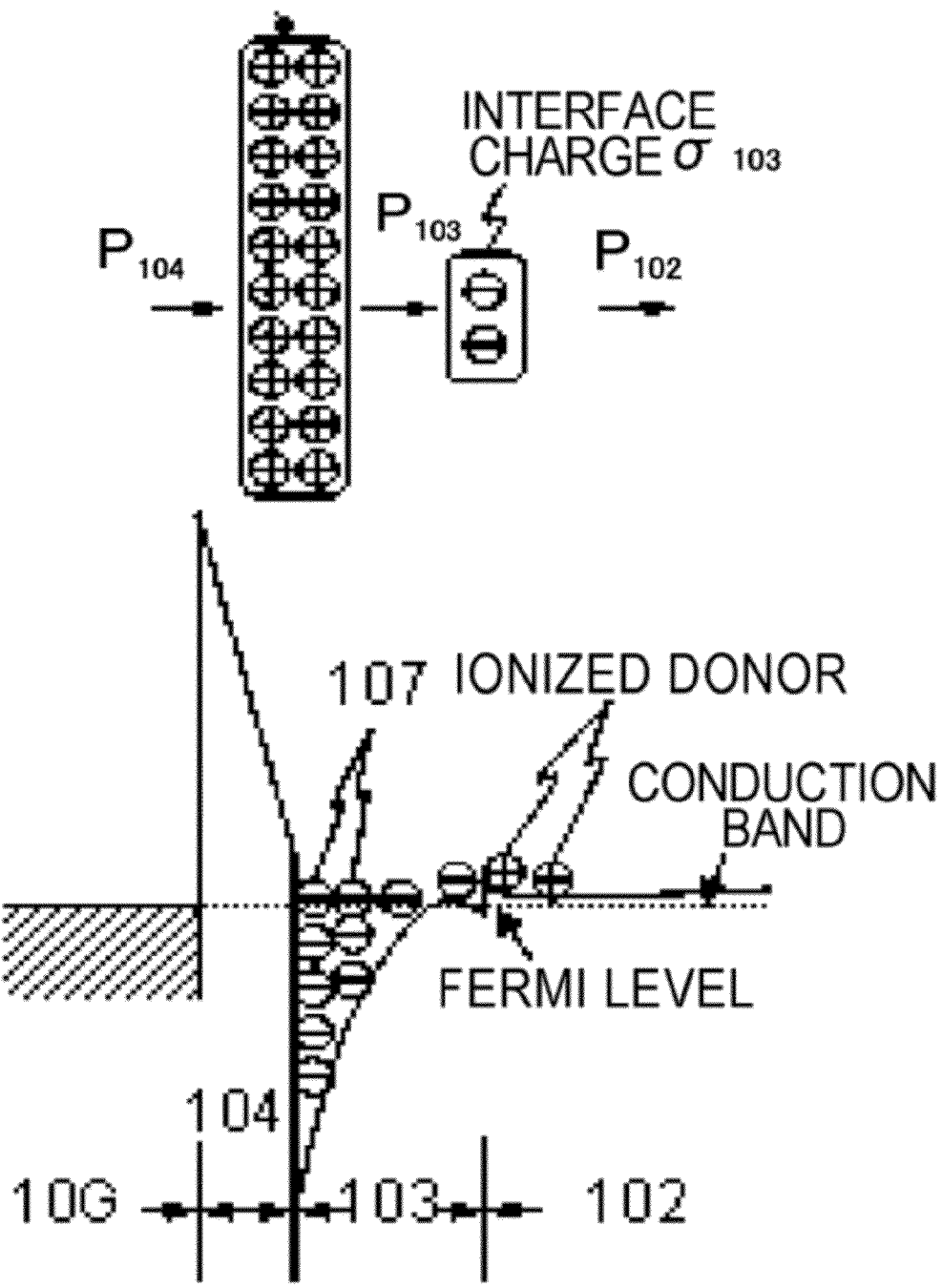
FIG. 8 It is an energy band diagram for a region under a gate electrode of a conventional technology.
Figure 9:
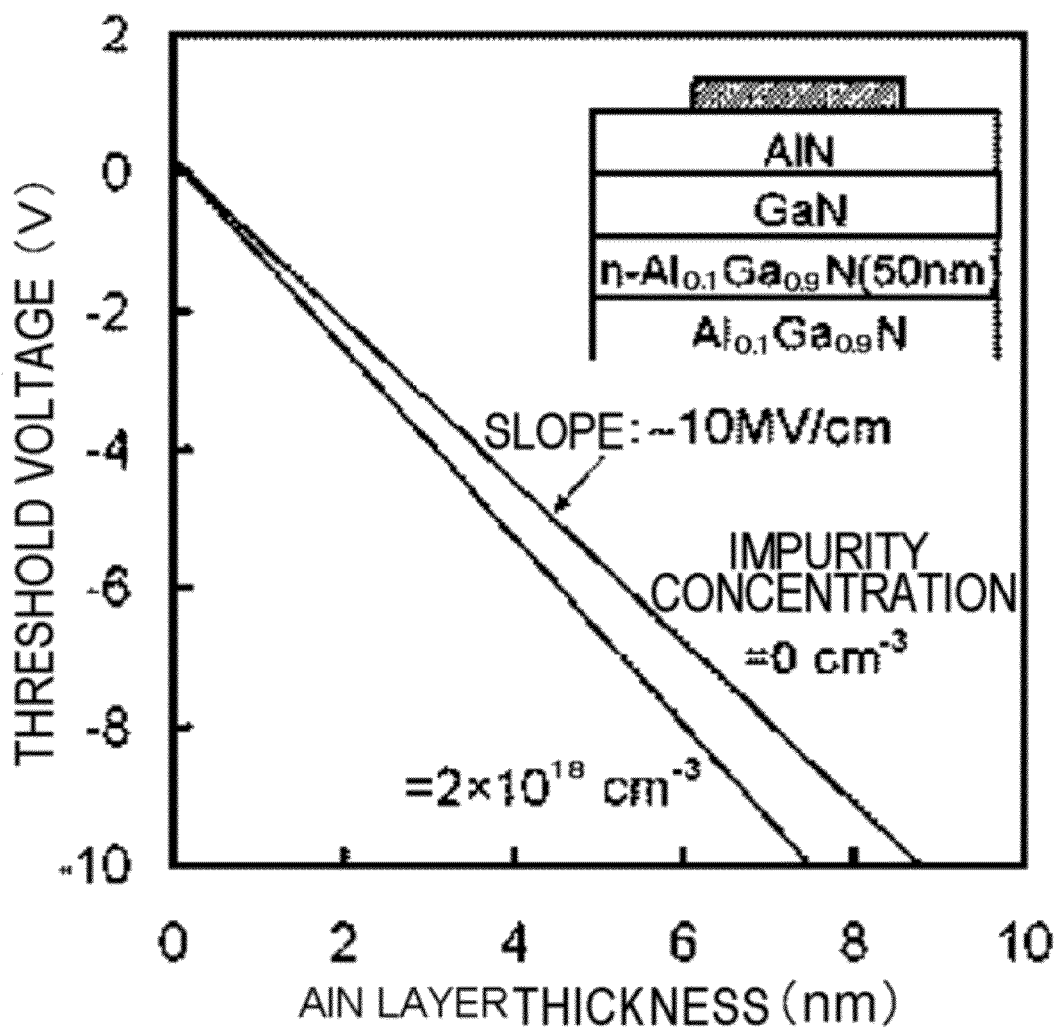
FIG. 9 It is a graph showing dependency of threshold voltage of a semiconductor device on a thickness of an insulating film according to a conventional technology.
Figure 10:
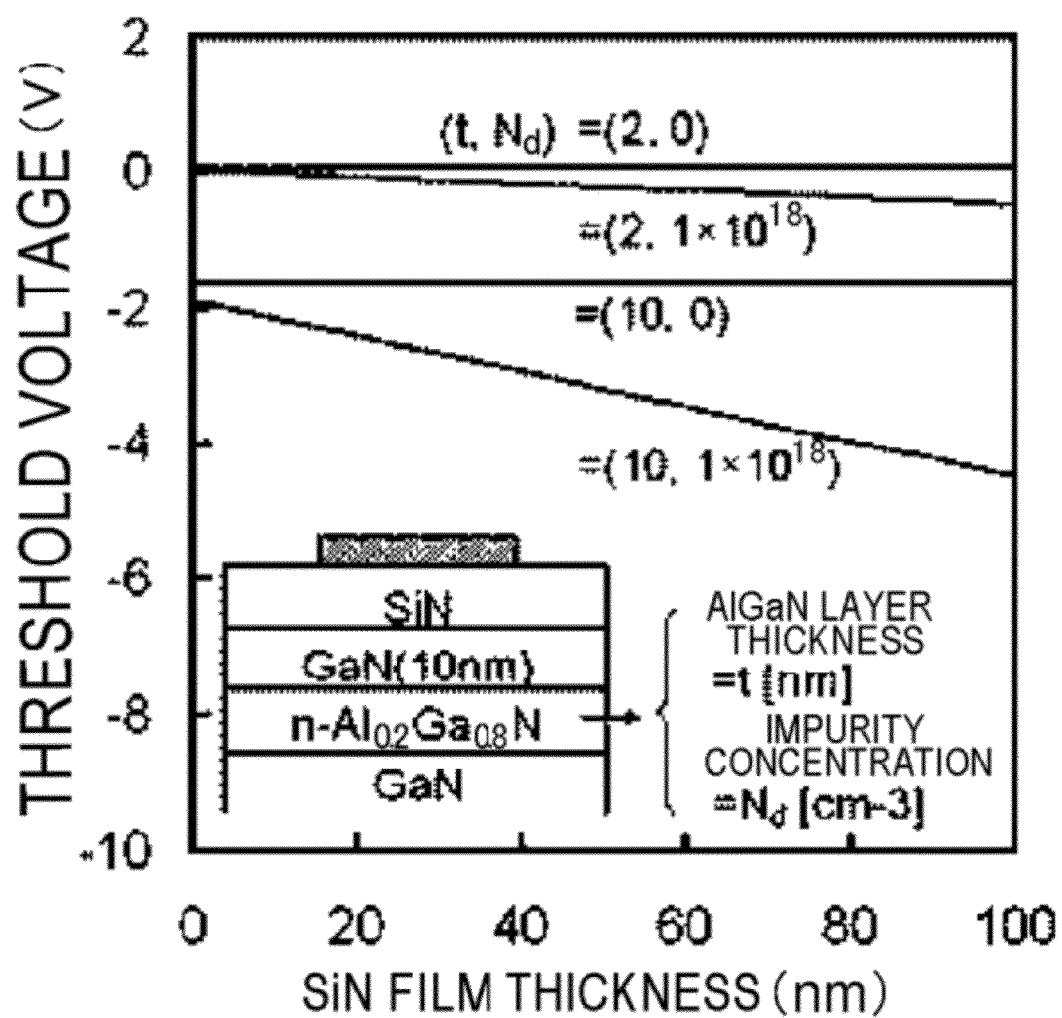
FIG. 10 It is a graph showing dependency of threshold voltage of a semiconductor device on a thickness of an insulating film according to a conventional technology.

The present embodiment presents another configuration for prevent an increase in the access resistance due to an enhancement operation, similarly as in second embodiment. FIG. 6 is a diagram, illustrating a cross-sectional structure of a semiconductor device according to third embodiment of the present invention. The semiconductor device of the present embodiment includes the SiC substrate 10, the buffer layer 11, the insulating film 15, the source electrode 1S, the drain electrode 1D, and the gate electrode 1G, which are similar to that of the above-described embodiment. A lower barrier layer 32 composed of undoped $Al_xGa_{1-x}N$ (for example, x=0.1) is formed on the buffer layer 11, and a channel layer 33 composed of undoped GaN is formed on the lower barrier layer 32. The lower barrier layer 32 is a layer in a state of strain relaxation, and the thickness thereof is similar to that of the above-described embodiment. The lower barrier layer 32 is an epitaxially grown layer. The channel layer 33 is a layer having a compressive strain, and the thickness thereof is similar to that of the above-described embodiment. The channel layer 33 is an epitaxially grown layer. In the present embodiment, all region of the channel layer 33 except the region right under the gate electrode 1G are etched and are removed. More specifically, the channel layer 33 is provided only right under the gate electrode 1G. Further, the sections of the surface layer of the lower barrier layer 32 under the broken sections of the channel layer 33 are also broken. More specifically, in the present embodiment, trenches are formed in all regions except the section right under the gate electrode 1G extending over the channel layer 33 and the lower barrier layer 32. N-type semiconductor layers 38 fill the trenches. The N-type semiconductor layers 38 are layers of a group III-nitride semiconductor doped with an N-type impurity, and for example, are layers composed of GaN doped with Si. In a cross section perpendicular to the surfaces of the respective layers, the N-type semiconductor layers 38 are disposed to sandwich the channel layer 33 right under the gate electrode 1G, and are in contact with the channel layer 33. The composition of the N-type semiconductor layer 38 may preferably be similar to that of the channel layer 33. Further, the insulating film 15 covers the channel layer 33, and also covers the entire regions of the N-type semiconductor layers 38 except regions right under the source electrode 1S and the drain electrode 1D. While the configuration of the channel layer 33, the configuration of the lower barrier layer 32 and the N-type semiconductor layer 38 of the present embodiment are different from that of the above-described embodiments, other configurations are similar to that of the above-described embodiments.

Such semiconductor device is manufactured as follows. The buffer layer 11 is deposited on the substrate 10 by a similar process as employed in the above-described embodiment. Then, an AlGaN layer serving as the lower barrier layer 32 is formed by a similar process as employed in the above-described embodiment. Further, the GaN layer serving as the channel layer 33 is formed on the AlGaN layer. The GaN layer is formed so as to cover the entire surface of the AlGaN layer. Then, for example, after $SiO_2$ is deposited by a PECVD process, a patterned resist is formed at a location for forming a gate. Portions of the GaN channel layer 33 and the AlGaN layer 32 are etched off by employing a $Cl_2$-based gas to form trenches.

After stripping the resist, N-type GaN (for example, an impurity concentration is $5\times10^{18}$ cm$^{-3}$) may be epitaxially grown through a mask of an $SiO_2$ pattern to selectively grow the N-type semiconductor layer 38 only in the trench. Next, the source electrode 1S and the drain electrode 1D are formed the insulating film 15 is formed and the gate electrode 1G is formed by a similar process as employed in the above-described embodiment. In this way, the semiconductor device as FIG. 6 is manufactured. According to the above-described present embodiment, the following advantageous effects can be provided, in addition to the similar advantageous effects as obtained in second embodiment. A diagram of energy band under the gate electrode 1G in the present embodiment is similar to FIG. 5. In the present embodiment, a negative charge (σ13) is generated in the interface of the lower barrier layer 32 with the channel layer 33 by the polarizing effect. Such negative interface charge allows more stable enhancement operation, similarly as in second embodiment. More specifically, no carrier is present in the channel layer 33 in a thermal equilibrium state of Vg=0 V. An application of a positive voltage to the gate induces generating a two-dimensional electron gas in the interface between the channel layer 33 and the lower barrier layer 32 and passing a drain electric current, and the semiconductor device functions as an enhancement type device. While electron travels in vicinity of the interface of the channel layer 23 with the insulating film 15 under the gate electrode 1G in this situation, an ionized impurity scattering is inhibited since the channel layer 33 is undoped, and thus electron mobility is improved.

Further, carrier electron is present at high density in the inside of the N-type semiconductor layer 38 regardless of the gate voltage. Thus, an increase in the access resistance is inhibited without a depletion of carrier in the region except the section under the gate electrode 1G in the enhancement operation. FIG. 3 shows that, in case of the present embodiment (concentration of impurity=0 cm$^{-3}$), the shifted value of the threshold voltage for changing the thickness of the insulating film 15 of the $Si_3N_4$ film by 1 nm is relatively small, namely about 0.14 V, and therefore enhanced uniformity and reproducibility of the threshold voltage are presented. Larger band gap of $Si_3N_4$ constituting the insulating film 15 provides an increased Schottky barrier height. Thus, enhanced forward gate breakdown voltage of the semiconductor device is also achieved. Further, smaller internal electric field of the insulating film 15 allows inhibiting the tunneling current component and reducing reverse leakage current in the case of the inverse biasing. While the portions of the channel layer 33 and the lower barrier layer 32 are etched off in the present embodiment to form trenches in the present embodiment, only the channel layer 33, of course, may be etched off.

While the present invention have been described in reference to the above-described embodiments, the present invention is not limited to the above-described embodiments only, and various types of other embodiments pursuant to the principle and the spirits of the present invention may be of course included. For example, while the above-described embodiments employ AlGaN for the material of the lower barrier layer, other type of group III nitride semiconductors may be alternatively employed. For example, GaN, InGaN, InAlN or InAlGaN may be employed.

Alternatively, a superlattice layer having an average composition, which is equivalent to the composition of InGaN, AlGaN, InAlN, or InAlGaN, may be employed.

However, AlGaN, InAlN, InAlGaN and the like, which are expected to provide larger band gap may be preferably employed for the lower barrier layer, in view of ensuring sufficient conduction band offset of not smaller than a certain value and providing improved buffer breakdown voltage.

While GaN is employed for the channel material in the above-described embodiments, other group III nitride semiconductor having a band gap that is smaller than the lower barrier layer may alternatively be employed. For example, InN, InGaN, AlGaN, InAlN or InAlGaN may be employed. However, GaN, InGaN, InAlGaN may be preferably employed for the channel layer, in view of ensuring sufficient conduction band offset, providing improved channel breakdown voltage, and providing improved electron mobility. Alternatively, a superlattice layer having an average composition, which is equivalent to the composition of InGaN, AlGaN, InAlN, or InAlGaN, may be employed for the channel layer. While the channel layer is undoped, a part or whole of the channel layer may alternatively be doped with N-type impurity such as Si and the like.

While the N-type AlGaN layer is formed so as to be in contact with the GaN channel layer in the above-described embodiments, an undoped AlGaN spacer layer may alternatively be disposed between the GaN layer and the N-type AlGaN layer.

While $Si_3N_4$ is employed for the insulating film in the above-described embodiments, the film may be polycrystalline or amorphous, and may be of other insulator. For example, a polycrystalline or amorphous material of any of silicon dioxide ($SiO_2$), silicon oxynitride ($Si_{1-a-b}O_bN_b$ ($0<a<1, 0<b<1$, $a+b<1$)), gallium oxide ($Ga_2O_3$), aluminium oxide ($Al_2O_3$), zinc oxide (ZnO), magnesium oxide (MgO) and hafnium oxide ($HfO_2$) may be employed. Alternatively, the film may alternatively be composed of a multiple-layered film composed of two or more insulators selected from silicon dioxide ($SiO_2$), silicon oxynitride ($Si_{1-a-b}O_aN_b$ ($0<a<1$, $0<b<1$, $a+b<1$)), gallium oxide ($Ga_2O_3$), aluminum oxide ($Al_2O_3$), zinc oxide (ZnO), magnesium oxide (MgO) and hafnium oxide ($HfO_2$). The use of such insulating film provides improved gate breakdown voltage.

Among these, in view of reducing the performance instability such as electric current collapse phenomenon, electric current drift phenomenon and the like, it is preferable to employ an insulating film of silicon nitride, silicon dioxide, silicon oxynitride, aluminum oxide ($Si_3N_4$, $SiO_2$, SiON, $Al_2O_3$) and the like, which are expected to provide reduced interface trap density.

Further, while SiC is employed for the substrate material in the above-described embodiment, other type of substrate may alternatively be employed. For example, sapphire, Si, or GaN may be employed. Further, while the lower barrier layer is undoped in third embodiment, an N-type impurity may be alternatively added. For example, an N-type impurity may be added at a lower concentration for achieving enhancement operation.

The present application is the National Phase of PCT/JP2008/003948, filed Dec. 25, 2008, which is based on, and claims priority of, Japanese Patent Application No. 2007-334,674 filed 26 Dec. 2007, the disclosure of which is hereby incorporated by reference herein in its entirety.

The invention claimed is:

1. A semiconductor device, comprising:
   a lower barrier layer composed of a layer of AlxGa1-xN ($0 \leq x \leq 1$) in a state of strain relaxation; and
   a channel layer composed of a layer of InyGa1-yN ($0 \leq y \leq 1$) disposed on said lower barrier layer, said channel layer having band gap that is smaller than band gap of said lower barrier layer and exhibiting compressive strain,
   wherein a gate electrode is formed over said channel layer via an insulating film, and a source electrode and a drain electrode serving as ohmic electrodes are formed over said channel layer,
   wherein said insulating film is polycrystalline or amorphous, and
   wherein said insulating film covers over entire region of said channel layer sandwiched by said source electrode and said drain electrode, and circumference section of said insulation film covers sections of upper surfaces of said source electrode and said drain electrode.

2. The semiconductor device as set forth in claim 1, wherein said insulating film is composed of a single layer film or a multiple-layered film, which is selected from a group consisting of a polycrystalline body or amorphous body of silicon nitride, silicon dioxide, oxynitride silicon, aluminum oxide, gallium oxide, zinc oxide, magnesium oxide and hafnium oxide.

3. The semiconductor device as set forth in claim 1, wherein said insulating film is formed directly on said channel layer.

4. The semiconductor device as set forth in claim 1, wherein said lower barrier layer is doped with an N-type impurity.

5. The semiconductor device as set forth in claim 1, wherein an N-type impurity is added to a region of said channel layer or said lower barrier layer including a region under said source electrode and under said drain electrode and excluding a region under said gate electrode.

6. The semiconductor device as set forth in claim 1,
   wherein said channel layer is selectively provided under said gate electrode,
   wherein N-type semiconductor layers are provided under said source electrode and said drain electrode, respectively, and
   wherein said N-type semiconductor layers are disposed so as to sandwich said channel layer in a cross-sectional view perpendicular to surfaces of the respective semiconductor layers.

7. The semiconductor device as set forth in claim 1, wherein the semiconductor device is configured to generate two-dimensional electron gas in an interface of said channel layer with said lower barrier layer.

8. The semiconductor device as set forth in claim 1, wherein said semiconductor device is a positive enhancement-type semiconductor device.

* * * * *